US012782445B2

(12) United States Patent
Axén

(10) Patent No.: US 12,782,445 B2
(45) Date of Patent: Nov. 3, 2026

(54) METHOD FOR GENERATING A STATUS SIGNAL INDICATING A BATTERY CONDITION STATUS OF A NIMH BATTERY PACK, AND MONITORING UNIT AND A QUALITY CONTROL SYSTEM

(71) Applicant: Nilar International AB, Täby (SE)

(72) Inventor: Jenny Axén, Danderyd (SE)

( * ) Notice: Subject to any disclaimer, the term of this patent is extended or adjusted under 35 U.S.C. 154(b) by 190 days.

(21) Appl. No.: 18/695,967

(22) PCT Filed: Sep. 29, 2022

(86) PCT No.: PCT/SE2022/050868

§ 371 (c)(1),
(2) Date: Mar. 27, 2024

(87) PCT Pub. No.: WO2023/055278

PCT Pub. Date: Apr. 6, 2023

(65) Prior Publication Data

US 2024/0385251 A1 Nov. 21, 2024

(30) Foreign Application Priority Data

Sep. 30, 2021 (SE) .................................... 2151205-8

(51) Int. Cl.
*G01R 31/371* (2019.01)
*G01R 31/367* (2019.01)
(Continued)

(52) U.S. Cl.
CPC ......... *G01R 31/371* (2019.01); *G01R 31/367* (2019.01); *G01R 31/378* (2019.01);
(Continued)

(58) Field of Classification Search
None
See application file for complete search history.

(56) References Cited

U.S. PATENT DOCUMENTS

2018/0205236 A1 7/2018 Fu et al.
2019/0198940 A1* 6/2019 Komiyama ......... H01M 10/448
(Continued)

FOREIGN PATENT DOCUMENTS

EP 0972328 B1 1/2000

OTHER PUBLICATIONS

Ledovskikh et al., "Modelling of rechargeable NiMh batteries", Journal of Alloys and Compounds, 2003, pp. 742-745, vol. 356-357, Elsevier B.V.

*Primary Examiner* — Jas A Sanghera
(74) *Attorney, Agent, or Firm* — Capitol City TechLaw

(57) ABSTRACT

The present invention relates to a method (200) for generating a status signal (SS) indicating a battery condition status of a NiMH battery pack (101) comprising a plurality of NiMH cells (C1,C2,C3) using a monitoring unit (100). The monitoring unit (100) comprises: a measuring unit (102) operable to generate a data signal (DS) comprising information about measurements from the group of an internal pressure (Pi) of the NiMH battery pack (101): a battery voltage (Vb) of the NiMH battery pack (101); a battery current (Ib) flowing to, or from, the NiMH battery pack (101): a surface temperature (Text) of the NiMH battery pack (101). The monitoring unit further comprises a controlling unit (103) operable to receive the data signal (DS) from the measuring unit (102) and operable to generate the status signal (SS) wherein the controlling unit (103) is further operable to estimate the internal pressure of the NiMH battery pack (101) with a physical battery model (300). The method (200) comprising measuring (S1) the internal pressure; measuring (S2) the battery voltage (Vb); measuring (S3) the battery current (Ib); measuring (S4) the surface temperature (Text) of the NiMH battery pack; estimating (S5) an internal gas pressure of the NiMH battery pack (101) using the physical battery model (300) and said
(Continued)

measurements; generating (S6) the status signal indicating a battery condition status of the NiMH battery pack (101) based on a differential pressure between the estimated internal pressure and the measured internal pressure.

11 Claims, 5 Drawing Sheets

(51) Int. Cl.

| | |
|---|---|
| ***G01R 31/378*** | (2019.01) |
| ***G01R 31/3842*** | (2019.01) |
| ***G01R 31/388*** | (2019.01) |
| ***G01R 31/392*** | (2019.01) |
| ***H02J 7/90*** | (2026.01) |
| ***H02J 7/94*** | (2026.01) |
| ***H02J 7/96*** | (2026.01) |

(52) U.S. Cl.

CPC ....... *G01R 31/3842* (2019.01); *G01R 31/388* (2019.01); *G01R 31/392* (2019.01); *H02J 7/94* (2026.01); *H02J 7/96* (2026.01); *H02J 7/973* (2026.01); *H02J 7/977* (2026.01)

(56) References Cited

U.S. PATENT DOCUMENTS

| | | | | |
|---|---|---|---|---|
| 2020/0076011 | A1 | 3/2020 | Choi et al. | |
| 2020/0280108 | A1* | 9/2020 | Tomar | H01M 10/482 |
| 2021/0048482 | A1* | 2/2021 | Ukumori | G01R 31/392 |
| 2023/0025923 | A1* | 1/2023 | Ko | H01M 10/4285 |

* cited by examiner

METHOD FOR GENERATING A STATUS SIGNAL INDICATING A BATTERY CONDITION STATUS OF A NIMH BATTERY PACK, AND MONITORING UNIT AND A QUALITY CONTROL SYSTEM

This application claims priority under 35 USC 119(a)-(d) from SE patent application No. 2151205-8 filed Sep. 30, 2021, the entire content of which is incorporated herein by reference.

TECHNICAL FIELD

The present disclosure generally relates to the field of monitoring NiMH batteries and more specifically to a method of monitoring a NiMH battery pack using a monitoring unit with a physical battery model.

The present disclosure also relates to a monitoring unit, a quality control system and a monitoring system for NiMH battery packs.

BACKGROUND

In many applications, NiMH batteries with a long lifetime is of great interest. It is also important to monitor closely the health of the battery pack in order to provide safety and optimum performance. Traditionally, the NiMH battery pack were monitored using temperature, voltage and current measurements. For example during charge an increased temperature indicated that the charging is complete since the delivered power from the charger no longer converts to electric charge in the battery but instead causes heating of the battery.

In order to monitor NiMH batteries a deep understanding of the physical and chemical processes in the battery is necessary.

In the scientific community, some attempts to fully understand and model the NiMH battery has been performed. For example in LEDOVSKIKH, A, et. al. Modelling of rechargeable NiMH batteries. Journal of alloys and compounds, 356-357 (2003) 742-745. This publication discloses modeling of battery voltage, internal gas pressure and temperature. However, the published model does not provide a valid model for all possible states of the NiMH battery. Especially, the discharge process and the battery in rest is not modeled in this publication. Thus, in order to use this model the battery must be discharged to 0% state of charge. Otherwise, the initialization of parameters becomes cumbersome.

In order to closely monitor a battery condition of a NiMH battery a better model valid for all states of the NiMH battery and a deeper understanding of the processes within the battery are needed, and especially a model that is valid when charging from a state of charge other than 0%.

It is therefore of great interest for the battery community to have better models and new approaches to NiMH battery condition monitoring.

It would be advantageous to have a status signal indicating the battery condition of the NiMH battery. Such a signal would find plenty of use-cases within the battery community.

SUMMARY

An object of the present disclosure is to provide a method for generating a status signal indicating a battery condition status which seeks to mitigate, alleviate, or eliminate one or more of the above-identified deficiencies in the art and disadvantages singly or in any combination and to provide an improved method.

This object is obtained by a method for generating a status signal indicating a battery condition status of a NiMH battery pack. The NiMH battery pack comprises a plurality of NiMH cells. The method uses a monitoring unit, wherein the monitoring unit comprises a measuring unit operable to generate a data signal comprising information about measurements from the group of: an internal pressure of the NiMH battery pack; a battery voltage of the NiMH battery pack; a battery current flowing to, or from, the NiMH battery pack; a surface temperature of the NiMH battery pack. The monitoring unit further comprises a controlling unit operable to receive the data signal from the measuring unit and operable to generate the status signal. The controlling unit is further operable to estimate the internal pressure of the NiMH battery pack with a physical battery model. The method comprises measuring the internal pressure, measuring the battery voltage, measuring the battery current, measuring the surface temperature of the NiMH battery pack, estimating an internal gas pressure of the NiMH battery pack using the physical battery model and said measurements. The method further comprises generating the status signal indicating a battery condition status of the NiMH battery pack based on a differential pressure between the estimated internal pressure and the measured internal pressure.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1:
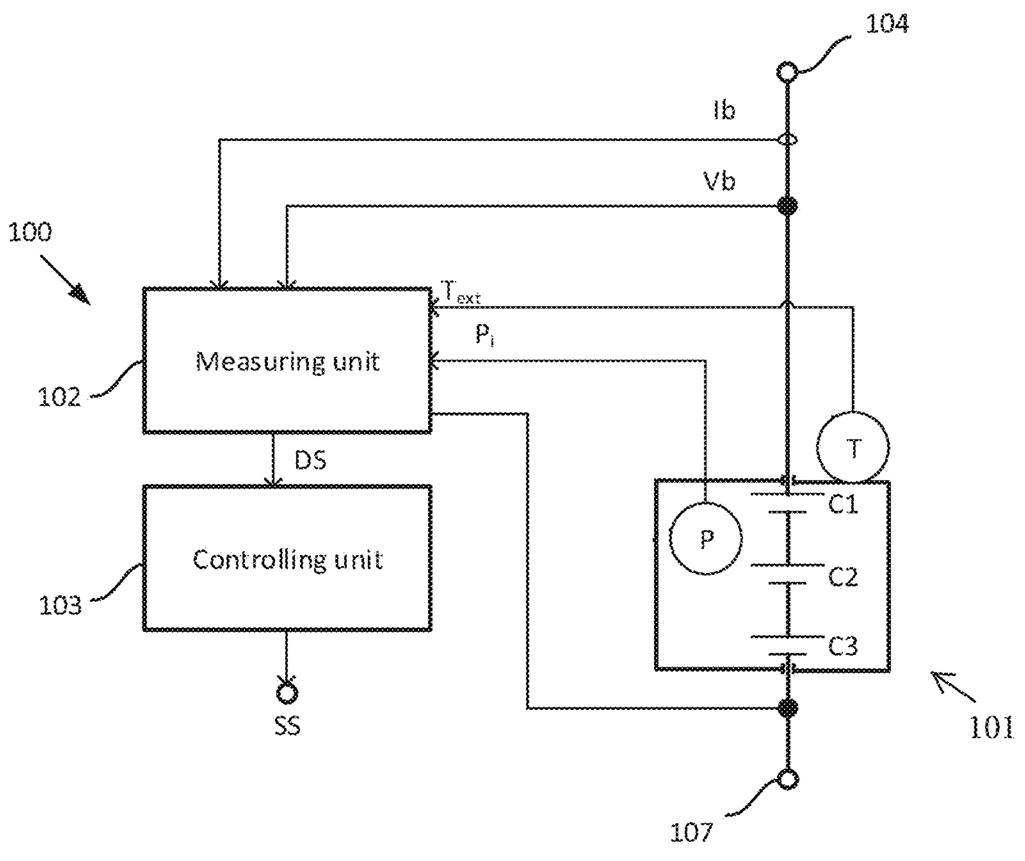
FIG. 1 is a schematic drawing of a monitoring unit according to one embodiment of the present invention.

Aspects of the present disclosure will be described more fully hereinafter with reference to the accompanying drawings. The apparatus and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

In this disclosure, the term 'NiMH battery pack' should be interpreted as an assembly of a plurality of NiMH battery cells electrically connected to each other.

Some of the example embodiments presented herein are directed towards a method for generating a status signal indicating a battery condition status of a NiMH battery pack. As part of the development of the example embodiments presented herein, a problem will first be identified and discussed.

The NiMH battery is a complex device with a large number of simultaneous physical and chemical processes that needs to be precisely described in order to assess the correct condition of the NiMH battery. For example, the internal pressure of a NiMH battery may have several root causes. For example, the internal pressure may raise due to elevated ambient temperature, or due to overcharging. Therefore, the internal pressure cannot be used in isolation to determine the condition of a NiMH battery.

The present inventor realized that these problems might be minimized or even eliminated by using a physical battery model that is valid in all regions of operation for the NiMH battery to estimate an internal pressure of the NiMH battery. This estimated internal pressure is then used together with a measured internal pressure to form a differential pressure. Since, the estimated internal pressure follows the measured internal pressure in all regions of operation for a healthy battery, a sudden deviation from the estimated internal pressure causes an increasing/decreasing differential pressure, which is a strong indication that something erroneous is going on within the NiMH battery pack that the model cannot model.

The present inventor has devised a method for generating the status signal indicating a battery condition status based on the differential pressure between the estimated internal pressure and the measured internal pressure.

Figure 2:
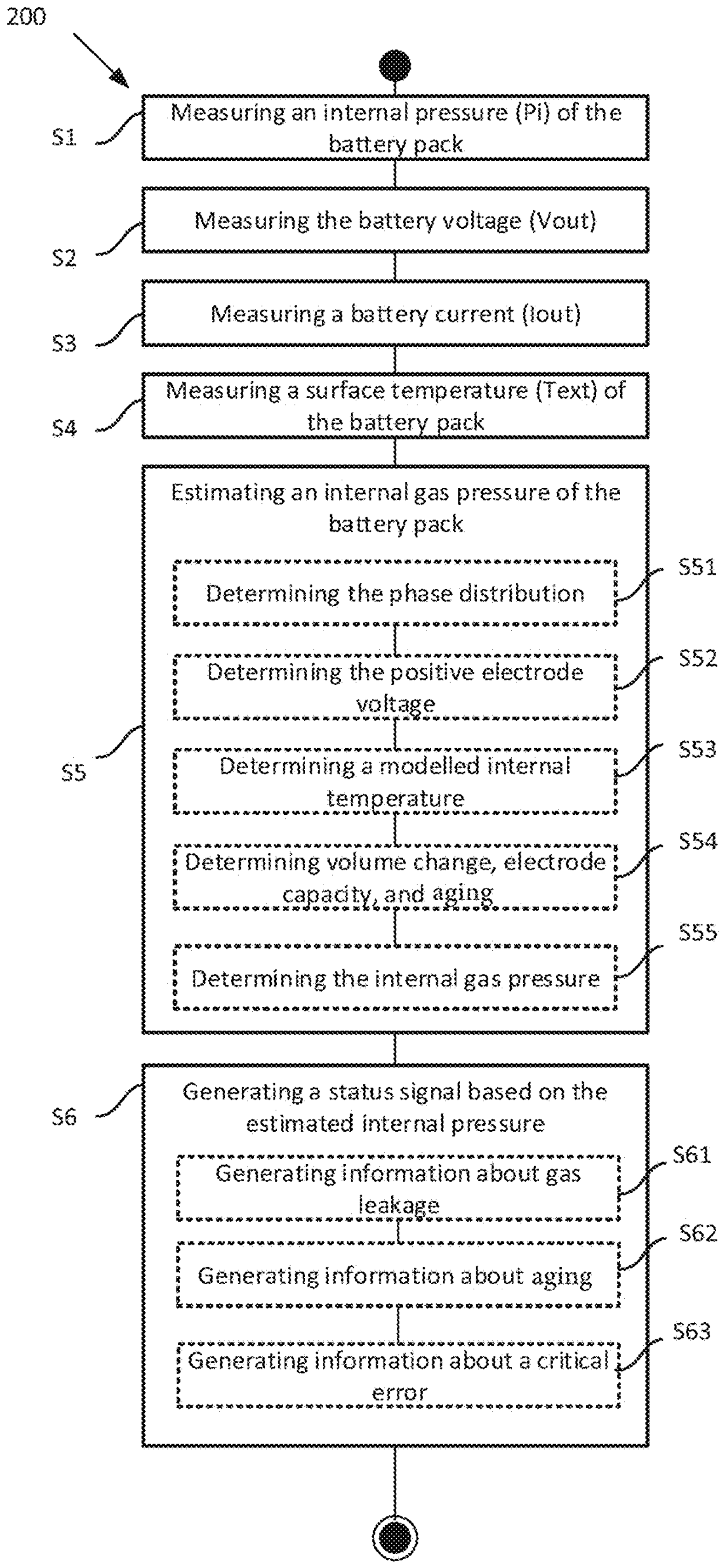
FIG. 2 is flow chart illustrating a method for generating a status signal according to one embodiment of the present invention.

Now with reference made to FIG. 1 and FIG. 2 one embodiment of a method 200 for generating a status signal SS indicating a battery condition status of a NiMH battery pack 101 comprising a plurality of NiMH cells C1,C2,C3 using a monitoring unit 100 will be disclosed.

The monitoring unit 100, as disclosed in FIG. 1, comprises a measuring unit 102 operable to generate a data signal DS comprising information about measurements. The measurements comes from the group of: an internal pressure Pi of the NiMH battery pack 101, a battery voltage Vb of the NiMH battery pack 101, a battery current Ib flowing to, or from, the NiMH battery pack 101, a surface temperature Text of the NiMH battery pack 101.

FIG. 1 discloses an embodiment of a monitoring unit 100 for monitoring a NiMH battery pack 101, comprising a measuring unit 102 operable to generate a data signal DS comprising information about measurements from the group of:

An internal pressure Pi of the NiMH battery pack 101.

A battery voltage Vb of the NiMH battery pack 101.

A battery current Ib flowing to, or from, the NiMH battery pack 101.

A surface temperature Text of the NiMH battery pack 101.

The monitoring unit further comprises a controlling unit 103 operable to receive the data signal from the measuring unit 102 and operable to generate a status signal indicating a battery condition status of a NiMH battery pack. The controlling unit 103 is further operable to estimate the internal pressure of the NiMH battery pack 101 with a physical battery model 300. The controlling unit 103 is further configured to execute the method 200 according to embodiments disclosed herein below.

Now with reference made to FIG. 2 in which an embodiment of the method 200 is disclosed in the form of a flowchart.

The method 200 comprises the following steps:

Step S1, measuring the internal pressure. In some embodiments, the internal pressure may be measured in a common volume. In some embodiments, the pressure may be measured by a plurality of pressure sensors.

Step S2, measuring the battery voltage Vb. This measured voltage is the measured voltage between the positive pole 104 and the negative pole 107 of the NiMH battery pack.

Step S3, measuring the battery current Ib. This current may in one embodiment additionally be used with a state of charge estimator for determining the actual state-of-charge for the NiMH battery pack.

Step S4, measuring the surface temperature Text of the NiMH battery pack. The surface temperature of the NiMH battery pack is measured at a position in thermal contact with the NiMH battery cells of the NiMH battery pack 101. For example if the housing is of a metallic material with good thermal conductivity, a position on the housing may be optimal for measuring the surface temperature. The surface temperature is used in the model for determining the heat flux to the ambient surroundings of the NiMH battery pack.

Step S5, estimating an internal gas pressure of the NiMH battery pack 101 using the physical battery model 300 and said measurements.

Step S6, generating the status signal indicating a battery condition status of the NiMH battery pack 101 based on a differential pressure between the estimated internal pressure and the measured internal pressure.

Optionally, the step S6 of generating the status signal comprises a step S61 of generating information about gas leakage of the NiMH battery pack 101, when the differential pressure is below a first threshold.

Optionally, the step S6 of generating the status signal comprises a step S62 of generating information about aging of the NiMH battery pack during charging of the NiMH battery pack when the differential pressure increases above a second threshold.

Optionally, the step S6 of generating a status signal comprises a step S63 of generating information about a critical error in the NiMH battery pack when the differential pressure increases above a third threshold, during a discharge of the NiMH battery pack to a state-of-charge smaller than 5%.

Optionally, the step S6 of generating a status signal is based on historical measurements from said measuring unit.

Optionally, the step S1 of measuring the internal pressure is performed in a common volume for NiMH battery cells of the NiMH battery pack. It is also possible in one embodiment to measure the internal pressure in a plurality of NiMH battery cells and use these measurements.

The step of estimating S5 an internal gas pressure with the physical battery model comprises:

Step S51, determining the phase distribution for the two electrodes based on the measured current Ibat flowing from/to the NiMH battery, using a mass balance module with expressions for hydrogen and oxygen.

Step S52, determining the positive electrode voltage based on a negative electrode voltage, the measured cell voltage and a cell resistance using a voltage balance module.

Step S53, determining a modeled internal temperature Tin of the NiMH battery, wherein the measured temperature Text is used to determine the heat transfer from the NiMH battery to the surroundings of the NiMH battery stack using an energy balance module.

Step S55, determining the internal gas pressure P using a gas pressure module with expressions for nitrogen, water vapor, hydrogen and oxygen.

Optionally, the step S5 of estimating an internal gas pressure further comprises a step S54 of determining volume change, electrode capacity, and aging of the NiMH battery pack 101.

Figure 4:
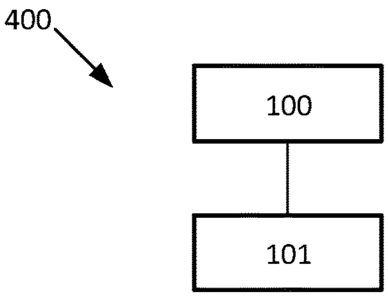
FIG. 4 is a block diagram illustrating a quality control system according to one embodiment of the present invention.

In the block diagram of FIG. 4 a quality control system 400 for a NiMH battery pack 101 is disclosed. The quality control system 400 comprises a monitoring unit 100 according to embodiments disclosed herein. The monitoring unit 100 is operable to detect leakage of a NiMH battery pack 101 according to embodiments disclosed herein. By monitoring the differential pressure between the measured internal pressure and the estimated internal pressure, a strong signal is obtained when a leaky battery cell is connected to the quality control system. In some battery quality control systems the battery is connected to a source-monitoring unit (SMU) or combinations of constant current generators and constant voltage generators, the method disclosed herein is nevertheless applicable to such a system.

Figure 5:
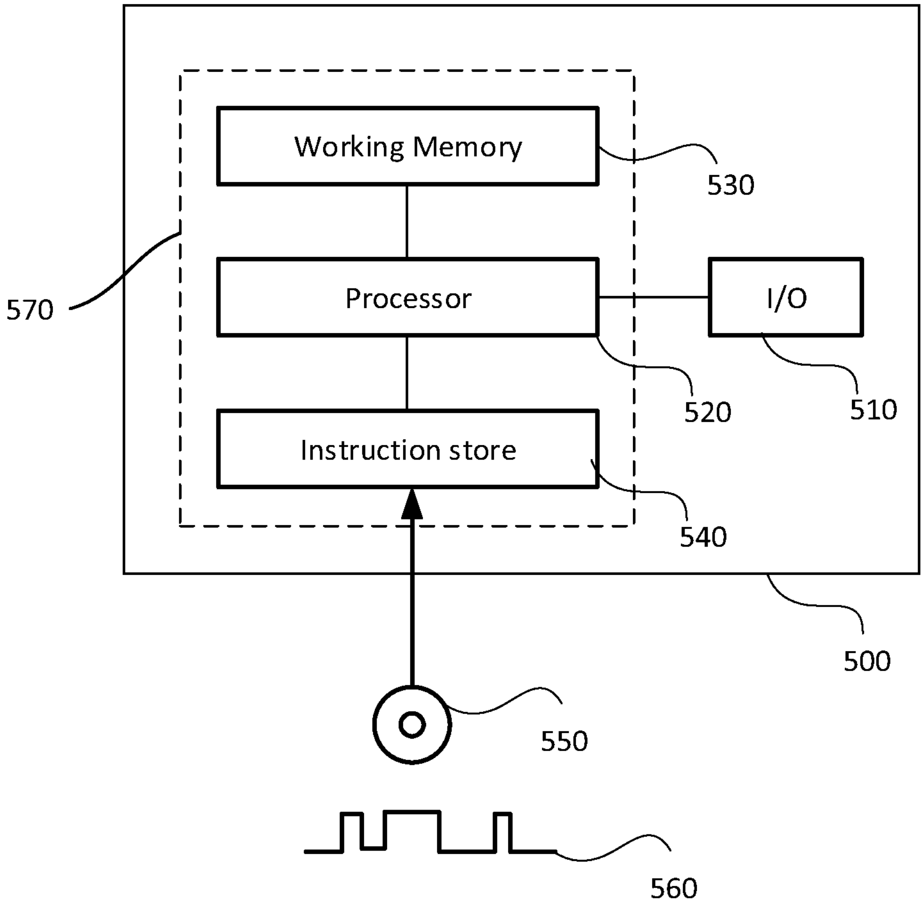
FIG. 5 is a block diagram illustrating a processor and computer storage medium according to one embodiment of the present invention.

FIG. 5 shows an exemplary implementation of the controlling unit 100, in programmable signal processing hardware. The signal processing apparatus 500 shown in FIG. 5 comprises an input/output (I/O) section 510 for receiving the data signal from the measuring unit and transmitting the status signal SS. The signal processing apparatus 500 further comprises a processor 520, a working memory 530 and an instruction store 540 storing computer-readable instructions which, when executed by the processor 520, cause the processor 520 to perform the processing operations herein above described for generating a status signal indicating a battery condition status of a NiMH battery pack. The instruction store 540 may comprise a ROM which is pre-loaded with the computer-readable instructions. Alternatively, the instruction store 540 may comprise a RAM or similar type of memory, and the computer readable instructions can be input thereto from a computer program product, such as a computer-readable storage medium 550 such as a CD-ROM, etc. or a computer-readable signal 560 carrying the computer-readable instructions.

In the present embodiment, the combination 570 of the hardware components shown in FIG. 5, comprising the processor 520, the working memory 530 and the instruction store 540, is configured to implement the functionality of the aforementioned controlling unit, which is described in detail with reference to FIG. 1.

FIG. 5 also illustrates a computer-readable storage medium 550 storing computer program instructions, which when executed by a processor 520, cause the processor 520 to perform a method according to embodiments disclosed herein.

Figure 6:
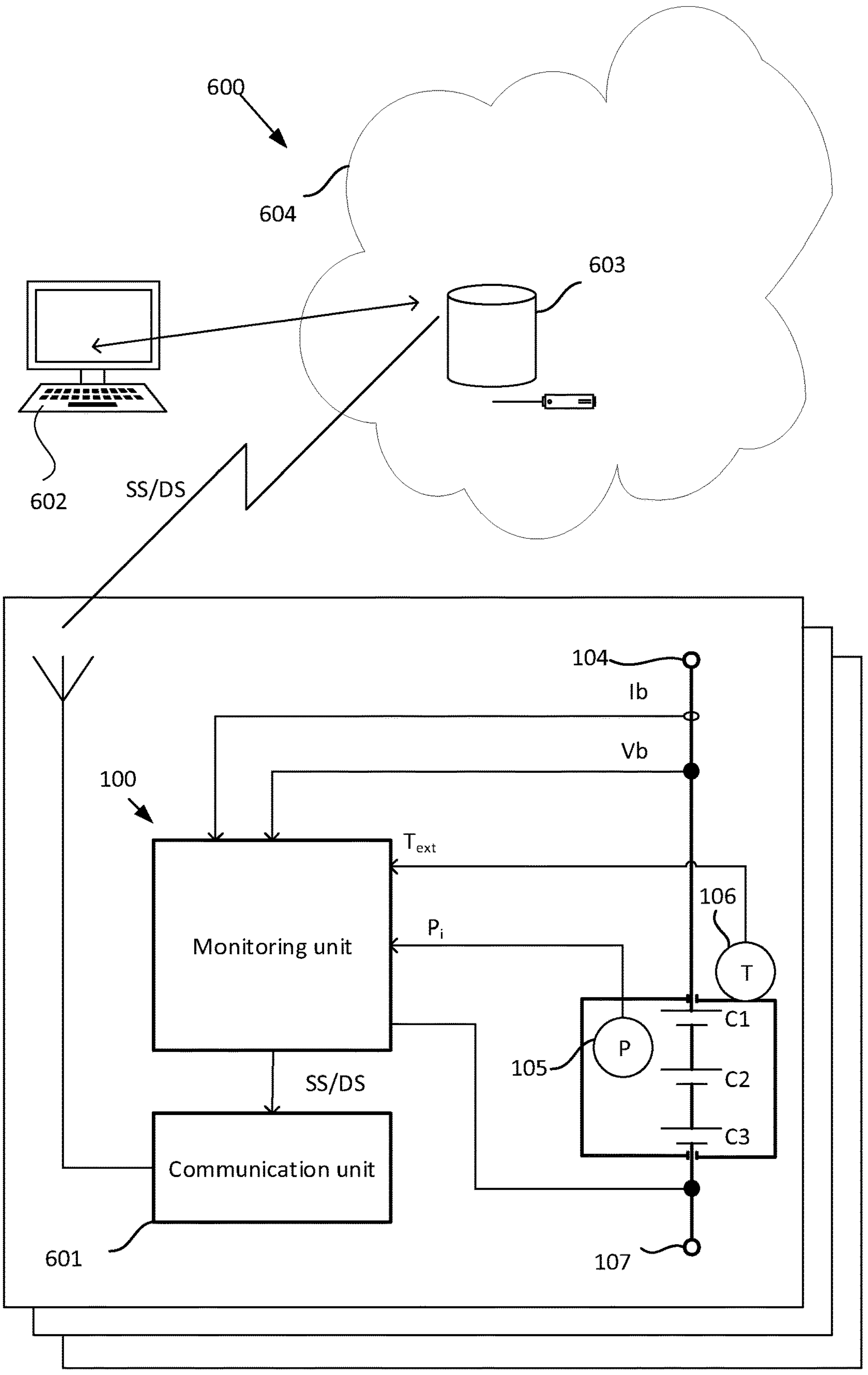
FIG. 6 is a block diagram illustrating a monitoring system according to one embodiment of the present invention.

FIG. 6 discloses a monitoring system 600 for a NiMH battery pack 101, comprising a monitoring unit 100 according to embodiments herein above. The monitoring system further comprises a communication unit 601 operable to recieve the status signal from the monitoring unit 100 and to transmit the status signal SS to a remote server 603. The remote server may be a virtual machine in a cloud 604. This server stores the status signal in a database such that the data is easily accessible from a remote workstation 602. This opens the possibility for machine learning and AI. Furthermore, errors in a NiMH battery pack may be detected remotely before an error in the NiMH battery pack occurs. In one embodiment, the communication unit 601 is operable to recieve the data signal from the measuring unit, and to transmit the data signal to the remote server. This means that the controlling unit may be implemented in the remote server and the physical battery model may be operable in the remote server. This has the advantage that the monitoring unit becomes simple and the demands on the processing capabilities is reduced.

Figure 3:
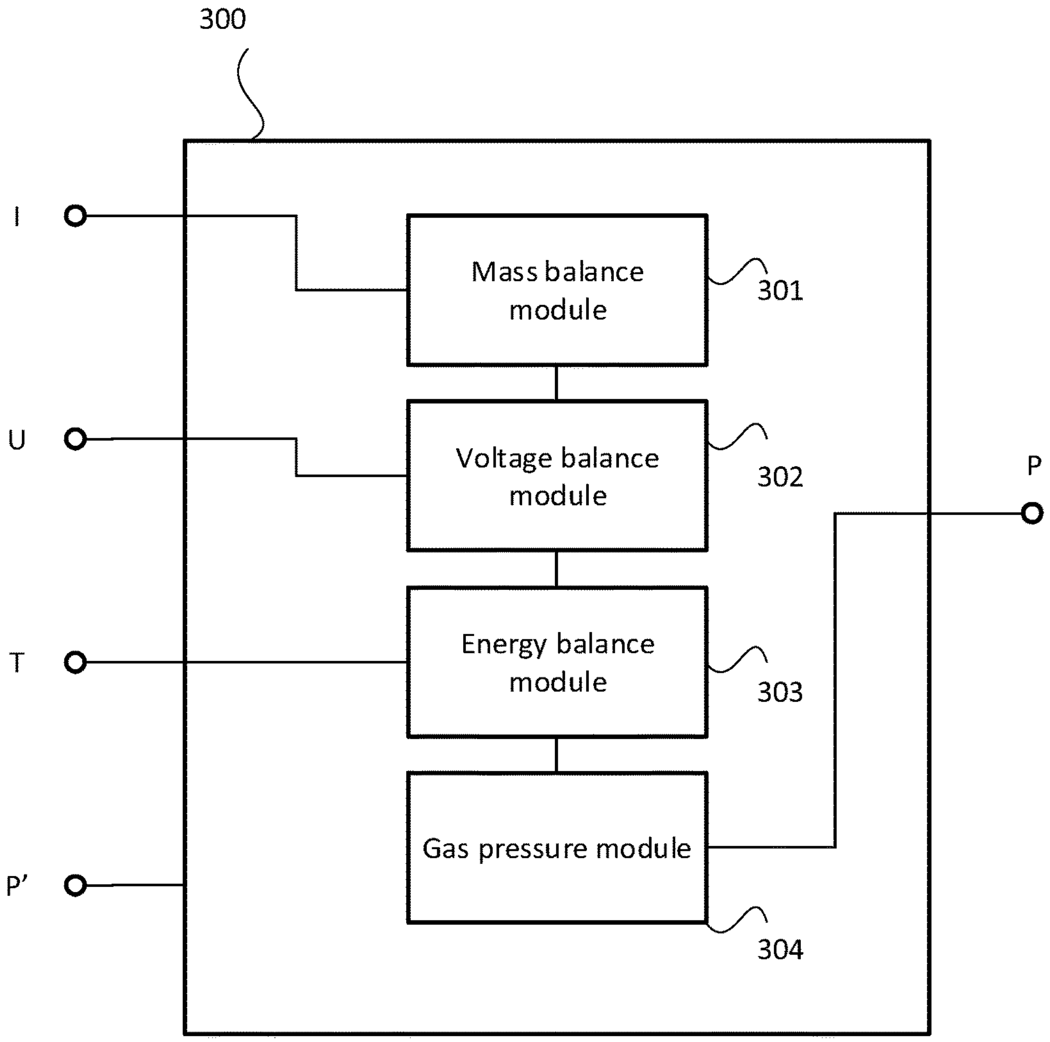
FIG. 3 is a block diagram illustrating one embodiment of a physical battery model according to one embodiment of the present invention.

In the following, the new physical gas model will be presented with reference made to FIG. 3. To describe the NiMH battery, a OD model based on the physical and electrochemical processes taking place in the battery is constructed. There are four different dependent variables in the model: T, $n_{H_2}$, $n_{O_2}$ and $x_{pos}$.

The pressure model is built around experimental data. The reason for this is that NiMH batteries have a significant hysteresis effect on the open-circuit-voltage, OCV, of the positive electrode. In any type of model for dynamic use that estimates the voltage, this hysteresis effect needs to be accounted for. By using the experimental cell voltage instead, the need to simulate the positive electrode voltage and avoid the hysteresis problem can be bypassed altogether. When subtracting the modeled negative electrode voltage from the experimental cell voltage, the positive electrode voltage is obtained, which represents $E_{OCV}+\eta_{act}$. This can then be used to calculate the oxygen evolution, which is potential dependent. Three sets of data are used to supply a base to estimate the composition of the battery gas phase. The battery current, $I_{cell}$; the module surface temperature, $T_{exp}$; and the cell voltage, $E_{cell}$. The current is used to estimate the phase conversion and side reactions in the battery. The module surface temperature (Text) is used as an input to model the heat transfer from the module core to the surface. Finally, the experimental cell voltage is used to find the positive electrode voltage.

After setting up the model 300, the experimental pressure is used as comparison to the model generated pressure to fit the parameters using a Nelder-Mead optimization solver.

Mass Balance Module 301

The gas composition in the battery is dependent on the overall species composition in the battery as well as the phase composition of the electrodes. Therefore, the model is based on a series of mass balances.

To track the electrochemical consumption and production of species, the electrode current composition is modeled. Electrode currents are connected to the reactions occurring on the electrode, with the total sum of the reaction currents equaling the cell current. On the negative electrode, there are two reactions: The charge reaction and the recombination of oxygen gives the following current balance:

$$I_{cell} = -I_{MH} - I_{O_2}^{neg} \qquad 1$$

Which gives the charge current from the total cell current and the oxygen recombination current. The recombination current is given by an Arrhenius expression, with a fitted rate constant, $K_{O2}$, and the activation energy:

$$I_{O_2}^{neg} = K_{O_2} * p_{O_2} * e^{\frac{-E_{DO_2}^{a}}{R}\left(\frac{1}{T}-\frac{1}{T_0}\right)} \qquad 2$$

To make the equilibrium constant temperature dependent where a standard Arrhenius equation is used, a reference temperature is needed. It's assumed to be equal to the initial temperature: $T_0=T^{init}$.

The positive electrode current distribution is determined by three competing reactions: The charge/discharge reaction, the oxygen evolution reaction, and the Hydrogen oxidation reaction. This gives us the following current balance:

$$I_{cell} = I_{NiOOH} + I_{O_2}^{pos} + I_{H_2}^{pos} \quad 3$$

To estimate the oxygen production current, we first need an over potential vs. the equilibrium voltage. This over potential is found by comparing the equilibrium potential for oxygen evolution at the pH of the electrolyte, $E^0_{O2}$, to the positive electrode voltage according to $$\eta O2 = Epos - EO20 \quad 14$$

which is described in the next section. This in turn is used together with experimental data from Ayeb et al., who investigated the oxygen evolution kinetics in the NiMH system [16]. They study the reaction mechanism and kinetics and conclude that there are two different kinetic relationships: one for the partially charged $Ni(OH)_2$ electrode and one for the overcharging region. To make this model work in dynamic conditions we have combined these two empirical relationships so that the relationship for the partial charging is used for lower potentials, and when reaching higher potentials, the overcharge relationship is used. In this model, the two relationships are combined into. The exchange current density is dependent on both over potential and temperature. The oxygen evolution current is then found using the following relationship, where $k_{OER}$ is a fitted parameter:

$$I_{O_2}^{pos} = k_{OER} * e^{I_{OER}^{tafel}}$$

The hydrogen current is given by the assumption that any hydrogen that manages to reach the positive electrode surface has no kinetic limitation due to the high potential. It is therefore limited by the mass transport from the gaseous bulk to the electrode surface. For this, an Arrhenius expression is used, with the hydrogen pressure in the gaseous bulk as a driving force and with a fitting parameter $$K_{H_2}^{pos}$$

that serves as a combined reaction coefficient and mass transfer coefficient.

$$E_{DH_2}^{a}$$

is taken from Albertus. As in the case with the previous Arrhenius equation, $T_0=T^{init}$.

$$I_{H_2}^{pos} = K_{H_2}^{pos} * p_{H_2} * e^{\frac{-E_{DH_2}^{a}}{R}\left(\frac{1}{T}-\frac{1}{T_0}\right)}$$

The electrode currents can then be used to keep track of the molar amounts of hydrogen and oxygen present in the battery through the establishment of molar balances. The oxygen amount present in the battery is modeled using a differential expression:

$$\frac{dn_{O_2}}{dt} = \frac{I_{O_2}^{pos} + I_{O_2}^{neg}}{4F} \quad 4$$

$$\text{with } n_{O_2}^{init} = \frac{p_{O_2}^{init} V_{gas}^{init}}{RT^{init}}.$$

Here, as no oxygen intercalation is made and little gas is solved in the electrolyte due to the starved configuration of the battery, all oxygen is assumed to be in the gas phase. As oxygen is recombined swiftly at the negative electrode and the battery is at rest at the beginning of the experiments, the initial oxygen pressure is assumed to be close to zero with port $$p_{O_2}^{init} = 0.001 \text{ atm.}$$

As for hydrogen, the hydrogen present in the battery is also modeled using a differential expression:

$$\frac{dn_{H_2}}{dt} = \frac{I_{H_2}^{pos} + I_{MH}}{2F} \quad 5$$

$$\text{With } n_{H_2}^{init} = \frac{x_{neg}^{init} q_{neg}}{2F}.$$

Since the hydrogen in the battery can be found both in the gas phase and in the negative electrode, the distribution is a bit more complex than for oxygen. However, in the case of this battery $$n_{H_2}^{(g)} \ll n_{MH},$$

which makes it possible to simplify the expression so that all hydrogen in the total mole balance is intercalated in the electrode:

$$n_{H_2} = 2n_{MH} \quad 6$$

Once the total mass balances have been established, the phase distribution expressions for the two electrodes can be formulated. For the negative electrode, we use the calculated molar amount of hydrogen to calculate the degree of intercalation:

$$x_{neg} = \frac{n_{MH}F}{q_{neg}} \quad 7$$

Where $x_{neg}=1$ is fully charged and $x_{neg}=0$ is fully discharged.

On the positive electrode, all the charge current results in intercalation, which gives the following expression:

$$\frac{dx_{pos}}{dt} = -\frac{I_{NiOOH}}{q_{pos}} \quad 8$$

Where $x_{pos}=0$ is fully charged and $x_{pos}=1$ is fully discharged. As the positive electrode fraction is one of the most predictable variables, two positive electrode fractions at determined test times are used to bind the model to a reasonable solution: The beginning of discharge $$(t^{BoD}, x_{pos}^{BoD});$$

and the end of discharge $$(t^{EoD}, x_{pos}^{EoD}).$$

While the degree of intercalation in the positive electrode is straight forward, the phase distribution is more complex. The discharged electrode is assumed to consist of $\beta$-Ni(OH)$_2$, which is then transformed to $\beta$-NiOOH as the electrode is charged according to the classic article by Bode et al. However, unlike the traditional Bode diagram it has been found that the charged material can exist in more than the $\beta$-NiOOH phase. When charged, the $\beta$-Ni(OH)$_2$ loses a hydrogen and a TP2 NiOOH-phase, with a similar unit cell, is produced. The kinetically favored TP2 NiOOH-phase can then collapse into a more thermodynamically favored phase, $\beta$-NiOOH, with a smaller unit cell. The fraction of the electrode present in the $\beta$-NiOOH phase is assumed to be in equilibrium with the TP2 NiOOH-phase and dependent on the electrode voltage. As such, it is modeled with an exponential expression using two fitted constants—$A_\beta$& $B_\beta$, the positive electrode potential, and the charge fraction of the electrode.

$$x_\beta = (1 - x_{pos})A_\beta * e^{-B_\beta E_{pos}} \quad 9$$

The positive electrode voltage is used on the assumption that the voltage behavior of the positive electrode is related to the phase of the material.

Voltage Balance Module 302

The positive electrode voltage can be estimated using the negative electrode voltage, the cell voltage, and the cell resistance according to the following expression:

$$E_{cell} = E_{pos} - E_{neg} + I_{cell}R_\Omega \quad 10$$

Where $R_\Omega$ is an experimentally determined resistance that depends on the state of charge of the positive electrode.

The negative electrode voltage was calculated using the Pressure Composite Isotherm (PCT) curve of the material. This curve plots the equilibrium pressure over the metal hydride as a function of hydrogen content. By keeping track of the hydrogen content in the electrode, the corresponding equilibrium pressure can be used for the hydrogen pressure dependent model expressions. The PCT is given at a certain temperature, so we use the Van't Hoff relation to adjust the temperature of the PCT curve.

$$\ln p_{H_2} = \frac{\Delta S^\circ_{MH}}{R}\left(1 - \frac{T_{ref}}{T}\right) + \frac{T_{ref}}{T}\ln p_{H_2}^{PCT} \quad 11$$

Where $T_{ref}$ is the temperature used when recording the PCT curve, and $$p_{H_2}^{PCT}$$

is the PCT hydrogen pressure. The Nernst equation, assuming $\gamma=1$ and $\alpha_{H_2O}=1$, gives the following expression for $E_{MH}$:

$$E_{MH} = E^\circ_{MH} - \frac{RT}{2F}\ln\left(\frac{p_{H_2}}{p^\circ_{H_2}}\right) \quad 12$$

Where we used the $$E^\circ_{MH}$$

given by Kleperis et al. [21]

Adding an over potential expression for the negative electrode had limited contribution to the model, resulting in the following simplified expression for the negative electrode:

$$E_{neg} = E_{MH} \quad 13$$

From the positive electrode potential, the oxygen evolution overpotential is calculated. This is needed to estimate the oxygen evolution reaction rate. The oxygen evolution overpotential is given by the following expression:

$$\eta_{O_2} = E_{pos} - E^0_{O_2} \quad 14$$

Where $$E^0_{O_2}$$

is the equilibrium potential for oxygen evolution.

Energy Balance Module 303

To find the model temperature, energy balance expressions are introduced. The model uses a modeled, internal temperature, T, which is calculated using the following ODE:

$$\frac{dT}{dt} = \frac{1}{V_{Cp}}\left(Q_\Omega + Q_{O_2} + Q_{MH} + Q_{NiOOH} + Q_{H_2} + Q_{H_2O}^{vap} - Q_{H_2}^{vap} - Q_{HT}\right) \quad 15$$

The battery is assumed to be at an even temperature when the experiment is started, and so the initial modeling temperature is equal to the initial experimental temperature, $T^{init}=T_{exp}(0)$.

To model the heat from reactions, the thermoneutral voltage is used. Since, the thermoneutral voltage hasn't been experimentally determined, both the thermoneutral cell voltage and an offset factor for the negative charge/discharge reaction are fitted.

$$E_{MH}^{therm} = E_{cell}^{therm} + E_{H_2}^{0} + E_{HM}^{therm\,offset} \quad 16$$

Once the thermoneutral voltage for the charge/discharge reaction on the negative electrode is obtained, the heat is calculated using the charge/discharge current and the voltage gap between the electrode voltage and the thermoneutral voltage:

$$QMH = I_{MH}\left(E_{neg} - E_{MH}^{cherm}\right) \quad 17$$

For the heat generation on the positive electrode the thermoneutral voltage is used in the same manner as for the negative electrode. For the positive electrode the following formula is used to calculate the thermoneutral voltage for the charge/discharge reaction:

$$E_{NiOOH}^{therm} = E_{cell}^{therm} - E_{MH}^{therm} \quad 18$$

The heat production is then calculated using the charge/discharge current and the difference between the positive electrode voltage and the thermoneutral voltage for the charge/discharge reaction:

$$Q_{NiOOH} = I_{NiOOH}\left(E_{pos} - E_{NiOOH}^{therm}\right) \quad 19$$

Apart from the main charge reactions on the positive and negative electrode there are heat contributions terms from other processes as well: Side reactions, phase changes, IR heating and conduction.

As described above, hydrogen in the gas phase can travel to the positive electrode and become oxidized. The heat contribution from this process is calculated using the following expression, where the oxidation current is multiplied with the voltage difference between the positive electrode voltage and the thermoneutral hydrogen oxidation voltage $E_{MH}$:

$$Q_{H_2} = I_{H_2}^{pos}\left(E_{pos} - E_{MH}^{therm}\right)20 \quad 20$$

Similarly, oxygen plays an important part in the side reactions. It will first be produced on the positive electrode towards end of charge when the voltage rises, and then recombined on the negative electrode. Each of these two reactions will contribute to the oxygen production and recombination heat term, using the same method as for the hydrogen oxidation:

$$Q_{O_2} = I_{O_2}^{pos}\left(E_{pos} - E_{O_2}^{therm}\right) + I_{O_2}^{neg}\left(E_{neg} - E_{O_2}^{therm}\right) \quad 21$$

There is also heat generated by phase changes in the system. There are two different expressions for this, as both water and hydrogen undergo phase changes. The phase-change heat is given by the following reactions:

$$Q_{H_2O}^{vap} = \frac{dp_{H_2O}}{dt} * \frac{V_{gas}}{RT}\Delta H_{vap,25^\circ C.}^{H_2O} \quad 22$$

$$Q_{H_2}^{vap} = \frac{dp_{H-2}}{dt} * \frac{V_{gas}}{RT}\left(\Delta H_{fus}^{H_2} + \Delta H_{vap}^{H_2}\right) \quad 23$$

Regarding the IR heating source term, it is the heat produced due to the ohmic resistance of the battery. Joule's first law is used to calculate the heat contribution:

$$Q_\Omega = R_\Omega I_{cell}^2 \quad 24$$

The final process is conductive heat transfer, which is driven by the temperature difference between the surface of the battery and the internal battery temperature. To find a driving force for conductive heat transfer, the experimental temperature is taken as the surface temperature of the battery.

$$T_{surf} = T_{exp} \quad 25$$

By using the experimental surface battery temperature, no knowledge of the ambient temperature is needed, something that makes modeling on-line in systems easier. The model temperature is regulated through fitting of the heat transfer constant, $K_T$, that determines the heat loss through conduction to the battery surface. The battery heat capacity, $V_{C_p}$,is also fitted. The energy balance below is used to estimate the heat transfer from the inside to the outside of the battery:

$$Q_{HT} = K_T(T - T_{surf}) \quad 26$$

Help Expressions

Apart from the mass, voltage and energy balances other expressions may be needed for a optimum model. These are the volume change expressions and the electrode capacity equations that include both initial values and aging.

The free gas volume is of importance for this model, as it governs nitrogen and oxygen pressure. So therefore, we need to keep track of the volumes of the electrodes. This is done through using the unit cell parameters to calculate the electrode volume if the electrode consisted of a singular phase. This is done for the charged and discharged phases of the electrodes:

$$V_\beta = V_\beta^{unit} * q_{pos} \quad (27)$$

$$V_{Ni(OH)_2} = V_{Ni(OH)_2}^{unit} * q_{pos} \quad (28)$$

$$V_M = V_M^{unit} * q_{neg} \quad (29)$$

$$V_{MH} = V_{MH}^{unit} * q_{neg} \quad (30)$$

The unit cell volume is calculated using the unit cell dimensions. Considering that all phases are of the hexagonal type with an equilateral parallelogram base and a 60° angle, the following geometrical relationship was used:

$$V^{unit} = c * a^2 * \sin 60 \quad (31)$$

Where the unit cell dimensions for the positive materials is from Oliva et al. The unit cell dimensions for the negative electrode are taken from Willems et al. The stored charge per cell was then used to calculate the volume per stored Ah.

Combining the expressions for total single-phase electrode volumes with the molar fractions of these phases results in expressions for the electrode volumes:

$$V_{pos} = V_{Ni(OH)_2}(1 - x_\beta) + x_\beta V_\beta \quad (32)$$

$$V_{neg} = x_{neg} V_{MH} + (1 - x_{neg}) V_M \quad (33)$$

With $$V_{pos}^{init} = V_{pos}(x_\beta^{init}) \text{ and } V_{neg}^{init} = V_{neg}(x_{neg}^{init}).$$

The gas volume can then be calculated from the following relationship:

$$V_{tot} = V_{pos} + V_{neg} + V_{gas} \quad (34)$$

Which also gives us $$V_{gas}^{init} = V_{tot} - V_{pos}^{init} - V_{neg}^{init}.$$

$V_{tot}$ is fitted to the data, as it is difficult to experimentally determining exactly what the total available volume is, but within a span that is reasonable judging from the dimensional parameters of the cell. This $V_{tot}$ only includes the gas volume and the volume of the active material, not electrolyte volume, separator volume or the volume of any carrier materials.

The battery is designed with positive limiting capacity, with a negative electrode that has a significantly larger capacity than the positive. This means that each electrode has its own capacity and intercalation expression. When initializing the model, it is important that the model is at the same electrode charge levels as the battery, which in the model is represented by the electrode intercalation fractions. The most predictable state is when the battery is fully discharged, which is where the experimental data in this study begins. That lets us put $x_{pos}$=1, but the initial intercalation in the negative electrode is more complex.

The intercalation of the negative electrode is the opposite of positive, so that when the electrode is fully discharged $x_{neg}$=0, and when the electrode is fully charged $X_{neg}$=1. However, it is not possible to initiate the model at $x_{neg}$=0 since the electrodes do not match up at fully discharged. This is due to a part of the battery manufacturing processes called the formation, where the battery goes through a string of processes designed to let the battery mature chemically to its functioning state. In the case of the NiMH battery, hydrogen is produced during this process, which is then intercalated into the negative electrode. This creates a hydrogen buffer which is commonly called the over-discharge reserve, $q_{OD}$, and that can be calculated from the ingoing composition of the positive electrode materials. The over-discharge capacity turns into an intercalation fraction using the following relationship:

$$x_{OD} = \frac{q_{OD}}{q_{neg}} \quad (35)$$

When initializing the model, the negative electrode intercalation faction can then be found through the following relationship:

$$x_{neg}^{init} = \frac{q_{pos}}{q_{neg}} * (1 - x_{pos}^{init}) + x_{OD} \quad (36)$$

When the battery ages, there is a need to add to these initial expressions to decide the negative electrode initial fraction and capacity. Since oxidation of the negative is the major aging mechanism of the NiMH battery, any aging will cause shifting of the electrode balances. This, in turn, has consequences for the hydrogen pressure in the cell. Aging affects the capacity of the negative electrode in two ways: The corroded material can no longer intercalate hydrogen, and so the total capacity is lowered; and the corrosion process produces hydrogen that is then intercalated into the negative electrode, increasing the over-discharge reserve. Leblanc et al. estimated this extra MH occupancy to 1.15 for each corroded site. This leads to the introduction of a constant, $k_{corr}$, to the model, which is fitted. This constant will promote a better description of battery age into account.

$$q_{neg} = q_{neg}^{new}(1 - k_{corr}) \quad (37)$$

$$q_{OD} = q_{OD}^{new} + 1.15 k_{corr} q_{neg}^{new} \quad (38)$$

Gas Pressure Module 304

Finally, once all of the previous equations have been set up for the system everything that is needed to set up the expressions for the cell pressure is in place. The pressure in the cell is given by four different gases: Nitrogen, water vapor, hydrogen, and oxygen. The first gas, Nitrogen, is present due to how the battery is manufactured. As the battery is filled with electrolyte air fills up the remaining empty volume. The amount of nitrogen in the cell is consistent over the cycles, but the pressure will vary with temperature and free gas volume. We have chosen to use the ideal gas law to track the nitrogen pressure over the charge/discharge cycle starting from the initial nitrogen pressure:

$$p_{N_2}^{init} = p_{exp}(0) - p_{H_2O}^{init} - p_{H_2}^{init} - p_{O_2}^{init} \tag{39}$$

$$p_{N_2} = p_{N_2}^{init} \frac{T V_{gas}^{init}}{T^{init} V_{gas}} \tag{40}$$

Second there is water present in the cell, which means that there will be water present in the gas phase. The water pressure in bar is calculated using an steam pressure equation adjusted for the hydroxide concentration, something that is necessary as the electrolyte is highly concentrate. The pressure is given in bar and the temperature in K.

$$\log_{10} p_{H_2O} = -0.01508 c_{KOH} - 0.0016788 c_{OH}^2 + 2.25887 * 10^{-5} c_{OH}^3 + (1 - 0.0012062 c_{OH} + 5.6024 * 10^{-4} c_{OH}^2 - 7.8228 * 10^{-6} c_{OH}^3) \left(35.4462 - \frac{3343.93}{T} - 10.9 * \log_{10} T + 0.0041645 T\right) \tag{41}$$

With $p_{H_2O}^{init} = p_{H_2O}(T^{init})$.

Hydrogen pressure has already been defined and is given by equation $$pH2 = \Delta SMH^{\circ} R1 - TrefT + TreftlnpH2PCT,$$

with $p_{H_2}^{init} = p_{H_2}(T^{init}, x_{neg}^{init})$.

Finally, we have the oxygen pressure which is developed as the battery nears the end of charge. The oxygen pressure is given as a function of the ideal gas law and the molar amount of oxygen present in the cell.

$$p_{O_2} = n_{O_2} \frac{RT}{V_{gas}} \tag{42}$$

In all, the total pressure in the cell is given by:

$$P_{tot} = P = P_{N_2} + p_{H_2O} + p_{H_2} + p_{O_2} \tag{43}$$

The disclosure relates to a method for generating a status signal indicating a battery condition status of a NiMH battery pack comprising a plurality of NiMH cells using a monitoring unit. The monitoring unit comprises: a measuring unit operable to generate a data signal comprising information about measurements from the group of: an internal pressure of the NiMH battery pack; a battery voltage of the NiMH battery pack; a battery current flowing to, or from, the NiMH battery pack; a surface temperature of the NiMH battery pack. The measuring unit further comprises a controlling unit operable to receive the data signal from the measuring unit and operable to generate the status signal wherein the controlling unit is further operable to estimate the internal pressure of the NiMH battery pack with a physical battery model. The method comprising measuring the internal pressure; measuring the battery voltage; measuring the battery current; measuring the surface temperature of the NiMH battery pack; estimating an internal gas pressure of the NiMH battery pack using the physical battery model and said measurements. The method further comprises generating the status signal indicating a battery condition status of the NiMH battery pack based on a differential pressure between the estimated internal pressure and the measured internal pressure.

According to some embodiments, the step of generating the status signal comprises generating information about gas leakage of the NiMH battery pack, when the differential pressure is below a first threshold.

According to some embodiments, the step of generating the status signal comprises generating information about aging of the NiMH battery pack during charging of the NiMH battery pack when the differential pressure increases above a second threshold.

According to some embodiments, the step of generating a status signal comprises generating information about a critical error in the NiMH battery pack when the differential pressure increases above a third threshold, during a discharge of the NiMH battery pack to a state-of-charge smaller than 5%.

According to some embodiments, the step of generating a status signal is based on historical measurements from said measuring unit.

According to some embodiments, the step of measuring the internal pressure is performed in a common volume for NiMH battery cells of the NiMH battery pack.

According to some embodiments, the step of estimating an internal gas pressure comprises: determining the phase distribution for the two electrodes based on the measured current flowing from/to the NiMH battery, using a mass balance module with expressions for hydrogen and oxygen; determining the positive electrode voltage based on a negative electrode voltage, the measured cell voltage and a cell resistance using a voltage balance module; determining a modeled internal temperature of the NiMH battery. The measured temperature is used to determine the heat transfer from the NiMH battery to the surroundings of the NiMH battery stack using an energy balance module; determining the internal gas pressure using a gas pressure module with expressions for nitrogen, water vapor, hydrogen and oxygen.

According to some embodiments, the step of estimating an internal gas pressure further comprises: determining volume change, electrode capacity, and aging of the NiMH battery pack.

This disclosure also relates to a monitoring unit for monitoring a NiMH battery pack, comprising: a measuring unit operable to generate a data signal DS comprising information about measurements from the group of: an internal pressure of the NiMH battery pack; a battery voltage of the NiMH battery pack; a battery current flowing to, or from, the NiMH battery pack; a surface temperature of the NiMH battery pack; a controlling unit operable to receive the data signal from the measuring unit and operable to generate the status signal. The controlling unit is further operable to estimate the internal pressure of the NiMH battery pack with a physical battery model. The controlling unit is further configured to execute the method according to embodiments disclosed herein.

This disclosure also relates to a quality control system for a NiMH battery pack, comprising a monitoring unit according to embodiments disclosed herein.

This disclosure also relates to a computer-readable storage medium storing computer program instructions which, when executed by a processor, cause the processor to perform a method according to methods disclosed herein.

This disclosure also relates to a monitoring system for a NiMH battery pack, comprising a monitoring unit according to embodiments herein; and a communication unit operable to recieve the status signal from the monitoring unit and to transmit the status signal to a remote server, or to transmit the data signal from the measuring unit of the monitoring unit to the remote server.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products.

It should be appreciated that the example embodiments presented herein may be practiced in any combination with each other. It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

The invention claimed is:

1. A method for generating a status signal (SS) indicating a battery condition status of a NiMH battery pack that includes a plurality of NiMH cells (C1,C2,C3) using a monitoring unit, the monitoring unit having:
- a measuring unit operable to generate a data signal (DS) that includes information about measurements from the group of
- an internal pressure (Pi) of the NiMH battery pack,
- a battery voltage (Vb) of the NiMH battery pack,
- a battery current (Ib) flowing to, or from, the NiMH battery pack, and
- a surface temperature (Text) of the NiMH battery pack; and
- a controlling unit operable to receive the data signal (DS) from the measuring unit and operable to generate the status signal (SS), wherein the controlling unit is further operable to estimate the internal pressure of the NiMH battery pack with a physical battery model;

the method comprising:
- measuring the internal pressure (Pi);
- measuring the battery voltage (Vb);
- measuring the battery current (Ib);
- measuring the surface temperature (Text) of the NiMH battery pack;
- estimating an internal gas pressure of the NiMH battery pack using the physical battery model and the measurements; and
- generating the status signal indicating a battery condition status of the NiMH battery pack based on a differential pressure between the estimated internal gas pressure and the measured internal pressure;
- wherein generating the status signal includes generating information about gas leakage of the NiMH battery pack, when the differential pressure is below a first threshold.

2. The method according to claim 1, wherein generating the status signal comprises generating information about aging of the NiMH battery pack during charging of the NiMH battery pack when the differential pressure increases above a second threshold.

3. The method according to claim 1, wherein generating the status signal comprises generating information about a critical error in the NiMH battery pack when the differential pressure increases above a third threshold, during a discharge of the NiMH battery pack to a state-of-charge smaller than 5%.

4. The method according to claim 1, wherein generating the status signal is based on historical measurements from the measuring unit.

5. The method according to claim 1, wherein measuring the internal pressure is performed in a common volume for NiMH battery cells of the NiMH battery pack.

6. The method according to claim 1, wherein estimating an internal gas pressure comprises:
- determining a phase distribution for two electrodes based on a measured battery current (Ibat) flowing from/to the NiMH battery, using a mass balance module with expressions for hydrogen and oxygen;
- determining a positive electrode voltage based on a negative electrode voltage, a measured cell voltage and a cell resistance using a voltage balance module;
- determining a modeled internal temperature (Tin) of the NiMH battery, wherein the measured surface temperature (Text) is used to determine heat transfer from the NiMH battery pack to the surroundings of the NiMH battery pack using an energy balance module;
- determining the internal gas pressure (P) using a gas pressure module with expressions for nitrogen, water vapor, hydrogen and oxygen.

7. The method according to claim 6, wherein estimating an internal gas pressure further comprises:
- determining volume change, electrode capacity, and aging of the NiMH battery pack.

8. A monitoring unit for monitoring a NiMH battery pack, comprising:
- a measuring unit operable to generate a data signal (DS) that includes information about measurements from the group of
- an internal pressure (Pi) of the NiMH battery pack,
- a battery voltage (Vb) of the NiMH battery pack,
- a battery current (Ib) flowing to, or from, the NiMH battery pack, and a surface temperature (Text) of the NiMH battery pack; and a controlling unit operable to receive the data signal from the measuring unit and operable to generate the status signal, wherein the controlling unit is further operable to estimate the internal pressure of the NiMH battery pack with a physical battery model;

wherein the controlling unit is further configured to execute the method according to claim 1.

9. A quality control system for a NiMH battery pack, comprising a monitoring unit according to claim 8.

10. A monitoring system for a NiMH battery pack, comprising:

a monitoring unit according to claim 9; and a communication unit operable to receive the status signal from the monitoring unit and to transmit the status signal to a remote server, or to transmit the data signal from the measuring unit of the monitoring unit to the remote server.

11. A non-transitory computer-readable storage medium storing computer program instructions which, when executed by a processor, cause the processor to perform a method as set out in claim 1.

* * * * *